US012650468B2

(12) United States Patent
    Zhu

(10) Patent No.: US 12,650,468 B2
(45) Date of Patent: Jun. 9, 2026

(54) PROCESSING METHOD AND APPARATUS FOR VIBRATION WAVEFORM, DEVICE, AND READABLE STORAGE MEDIUM

(71) Applicant: HONOR DEVICE CO., LTD., Shenzhen (CN)

(72) Inventor: Jianwei Zhu, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 533 days.

(21) Appl. No.: 17/801,246

(22) PCT Filed: Jan. 21, 2022

(86) PCT No.: PCT/CN2022/073170
    § 371 (c)(1),
    (2) Date: Aug. 20, 2022

(87) PCT Pub. No.: WO2022/242216
    PCT Pub. Date: Nov. 24, 2022

(65) Prior Publication Data
    US 2024/0192274 A1       Jun. 13, 2024

(30) Foreign Application Priority Data

| | | |
|---|---|---|
| May 20, 2021 | (CN) | 202110553942.2 |
| Jun. 16, 2021 | (CN) | 202110666473.5 |

(51) Int. Cl.
    *H02P 25/06* (2016.01)
    *G01R 31/34* (2020.01)
(52) U.S. Cl.
    CPC ............ *G01R 31/343* (2013.01); *H02P 25/06* (2013.01)
(58) Field of Classification Search
    CPC ........ G01R 31/343; G01R 31/34; H02P 25/06
    See application file for complete search history.

(56) References Cited

U.S. PATENT DOCUMENTS 8,619,497 B1 * 12/2013 Sallas .................... G01V 1/005
                                                         367/23
9,245,429 B2      1/2016 Saboune et al.
                       (Continued)

FOREIGN PATENT DOCUMENTS

| | | |
|---|---|---|
| CA | 2631299 A1 | 11/2009 |
| CN | 103746619 A | 4/2014 |

(Continued)

OTHER PUBLICATIONS

Jonghyun Ryu+posVibEditor; "Graphical authoring tool of vibrotactile patterns";2008 IEEE International Workshop on Haptic Audio visual Environments and Games; Oct. 18, 2008;6 pages.

*Primary Examiner* — Michael J Dalbo
*Assistant Examiner* — Denise R Karavias
(74) *Attorney, Agent, or Firm* — WOMBLE BOND DICKINSON (US) LLP

(57) ABSTRACT

Embodiments of this application provide a processing method and apparatus for a vibration waveform, a device, and a readable storage medium. In the processing method for a vibration waveform, a vibration description file is obtained, and a waveform type described in the vibration description file is recognized; a startup time and a stop time are extracted from the vibration description file in a case that the waveform type described in the vibration description file is a steady-state waveform; and an amplitude of the steady-state waveform within the startup time is processed as being smoothly changed from zero to an amplitude of the linear motor in a steady vibration state, and an amplitude of the steady-state waveform within the stop time is processed as being smoothly changed from the amplitude of the linear motor in the steady vibration state to zero.

14 Claims, 8 Drawing Sheets

(56)                    References Cited

U.S. PATENT DOCUMENTS

| 10,026,276 | B2 | 7/2018 | Rank et al. | |
|---|---|---|---|---|
| 10,965,803 | B2 | 3/2021 | Li et al. | |
| 11,132,062 | B2 | 9/2021 | Bajaj et al. | |
| 2005/0237011 | A1 | 10/2005 | Woods et al. | |
| 2008/0294984 | A1 | 11/2008 | Ramsay et al. | |
| 2013/0307441 | A1* | 11/2013 | Schuster | H02P 25/032 |
| | | | | 318/127 |
| 2018/0058463 | A1* | 3/2018 | Rollins | F04D 29/059 |
| 2019/0035236 | A1* | 1/2019 | Kim | H04R 29/00 |
| 2019/0391653 | A1 | 12/2019 | Ono et al. | |
| 2020/0057109 | A1* | 2/2020 | Deng | H02P 25/032 |
| 2020/0356173 | A1* | 11/2020 | Bajaj | G08B 6/00 |
| 2021/0110841 | A1 | 4/2021 | Maximilian et al. | |

FOREIGN PATENT DOCUMENTS

| CN | 105322842 | A | 2/2016 |
|---|---|---|---|
| CN | 106059440 | A | 10/2016 |
| CN | 106133650 | A | 11/2016 |
| CN | 107014480 | A | 8/2017 |
| CN | 207516516 | U | 6/2018 |
| CN | 207518495 | U | 6/2018 |
| CN | 109887528 | A | 6/2019 |
| CN | 111030412 | A | 4/2020 |
| CN | 111245190 | A | 6/2020 |
| CN | 111552377 | A | 8/2020 |
| CN | 111966211 | A | 11/2020 |
| CN | 112269895 | A | 1/2021 |
| CN | 112506341 | A | 3/2021 |
| CN | 112549986 | A | 3/2021 |
| EP | 1617553 | A2 | 1/2006 |
| EP | 2667582 | A1 | 11/2013 |
| EP | 2743800 | A2 | 6/2014 |
| EP | 2846221 | A1 | 3/2015 |
| JP | 2004032923 | A | 1/2004 |
| WO | 2012050362 | A2 | 4/2012 |
| WO | 2018223535 | A1 | 12/2018 |
| WO | 2019094440 | A1 | 5/2019 |

* cited by examiner

PROCESSING METHOD AND APPARATUS FOR VIBRATION WAVEFORM, DEVICE, AND READABLE STORAGE MEDIUM

CROSS-REFERENCE TO RELATED APPLICATIONS

This application is a national stage of International Application No. PCT/CN2022/073170, filed on Jan. 21, 2022, which claims priority to Chinese Patent Application No. 202110553942.2 filed on May 20, 2021, and Chinese Patent Application No. 202110666473.5 filed on Jun. 16, 2021. All of the aforementioned applications are hereby incorporated by reference in their entireties.

TECHNICAL FIELD

This application relates to the field of waveform processing technologies, and in particular, to a processing method and apparatus for a vibration waveform, a device, and a readable storage medium.

BACKGROUND

A waveform that controls a linear motor can be a steady-state waveform or a transient waveform. Specifically, when the linear motor is controlled to run in the steady-state waveform and does not run at a resonant frequency, there is an overdrive problem of the linear motor within a startup time and a stop time.

SUMMARY

This application provides a processing method and apparatus for a vibration waveform, a device, and a storage medium, to solve an overdrive problem of a linear motor within a startup time and a stop time.

In order to achieve the foregoing objective, this application provides the following technical solutions:

According to a first aspect, this application provides a processing method for a vibration waveform applicable to an electronic device that includes a linear motor. The processing method for a vibration waveform includes: first obtaining a vibration description file, and then recognizing a waveform type described in the vibration description file; in a case that the waveform type described in the vibration description file is found to be a steady-state waveform, extracting a startup time and a stop time from the vibration description file; and processing an amplitude of the steady-state waveform within the startup time as being smoothly changed from zero to an amplitude of the linear motor in a steady vibration state, and processing an amplitude of the steady-state waveform within the stop time as being smoothly changed from the amplitude of the linear motor in the steady vibration state to zero.

From content of the first aspect, it can be seen that within the startup time, the amplitude of the linear motor changes smoothly from zero to the amplitude of the linear motor in the steady vibration state, and within the stop time, the amplitude of the linear motor changes smoothly from the amplitude of the linear motor in the steady vibration state to zero, which can control the linear motor to run smoothly within the startup time and the stop time, thereby overcoming an overdrive problem.

In a possible implementation, a manner of processing the amplitude of the steady-state waveform within the startup time as being smoothly changed from zero to the amplitude of the linear motor in the steady vibration state may be: superimposing a cosine waveform on the steady-state waveform within the startup time, so that the amplitude within the startup time smoothly transitions from zero to the steady-state waveform with the amplitude of the linear motor in the steady vibration state.

In a possible implementation, a manner of processing the amplitude of the steady-state waveform within the startup time as being smoothly changed from zero to the amplitude of the linear motor in the steady vibration state may be: processing the steady-state waveform within the startup time by using an ascent algorithm, so that the amplitude within the startup time smoothly transitions from zero to the steady-state waveform with the amplitude of the linear motor in the steady vibration state.

In a possible implementation, a manner of processing the amplitude of the steady-state waveform within the stop time as being smoothly changed from the amplitude of the linear motor in the steady vibration state to zero may be: superimposing the cosine waveform on the steady-state waveform within the stop time, so that the amplitude within the stop time smoothly transitions from the amplitude of the linear motor in the steady vibration state to the steady-state waveform of zero.

In a possible implementation, a manner of processing the amplitude of the steady-state waveform within the stop time as being smoothly changed from the amplitude of the linear motor in the steady vibration state to zero may be: processing the steady-state waveform within the stop time by using the ascent algorithm, so that the amplitude within the stop time smoothly transitions from the amplitude of the linear motor in the steady vibration state to the steady-state waveform of zero.

According to a second aspect, this application provides a processing apparatus for a vibration waveform applicable to an electronic device that includes a linear motor. The processing apparatus includes: an obtaining unit configured to obtain a vibration description file; a recognition unit configured to recognize a waveform type described in the vibration description file; an extraction unit configured to extract a startup time and a stop time from the vibration description file in a case that the waveform type described in the vibration description file is a steady-state waveform; and a processing unit configured to process an amplitude of the steady-state waveform within the startup time as being smoothly changed from zero to an amplitude of the linear motor in a steady vibration state, and process an amplitude of the steady-state waveform within the stop time as being smoothly changed from the amplitude of the linear motor in the steady vibration state to zero.

From content of the second aspect, it can be seen that within the startup time, the processing unit processes the amplitude of the linear motor as being smoothly changed from zero to the amplitude of the linear motor in the steady vibration state, and within the stop time, the processing unit processes the amplitude of the linear motor as being smoothly changed from the amplitude of the linear motor in the steady vibration state to zero, which can control the linear motor to run smoothly within the startup time and the stop time, thereby overcoming an overdrive problem.

In a possible implementation, the processing unit, in a case of processing the amplitude of the steady-state waveform within the startup time as being smoothly changed from zero to the amplitude of the linear motor in the steady vibration state, is configured to: superimpose a cosine waveform on the steady-state waveform within the startup time, so that the amplitude within the startup time smoothly transitions from zero to the steady-state waveform with the amplitude of the linear motor in the steady vibration state; or process the steady-state waveform within the startup time by using an ascent algorithm, so that the amplitude within the startup time smoothly transitions from zero to the steady-state waveform with the amplitude of the linear motor in the steady vibration state.

In a possible implementation, the processing unit, in a case of processing the amplitude of the steady-state waveform within the stop time as being smoothly changed from the amplitude of the linear motor in the steady vibration state to zero, is configured to: superimpose the cosine waveform on the steady-state waveform within the stop time, so that the amplitude within the stop time smoothly transitions from the amplitude of the linear motor in the steady vibration state to the steady-state waveform of zero; or process the steady-state waveform within the stop time by using the ascent algorithm, so that the amplitude within the stop time smoothly transitions from the amplitude of the linear motor in the steady vibration state to the steady-state waveform of zero.

According to a third aspect, this application provides an electronic device, including: one or more processors and a memory that stores a program, the program, when executed by the one or more processors, causing the one or more processors to implement the processing method for a vibration waveform according to any one of the first aspect and the possible implementations of the first aspect.

According to a fourth aspect, this application provides a readable storage medium on which a computer program is stored, where the computer program, when executed by a processor, implements the processing method for a vibration waveform according to any one of the first aspect and the possible implementations of the first aspect.

BRIEF DESCRIPTION OF DRAWINGS

FIG. 4b is an exemplary flowchart of implementing functions of the software architecture shown in FIG. 4a;

DESCRIPTION OF EMBODIMENTS

The terms such as "first", "second", and "third" in the specification and claims of this application and in the accompanying drawings are intended to distinguish different objects, and are not intended to limit a specific order.

In this application, the terms "include", "comprise", or any other variants thereof are intended to cover a non-exclusive inclusion, such that processes, methods, articles or devices, including a series of elements, include not only those elements that have been listed, but also other elements that are not specifically listed or the elements intrinsic to these processes, methods, articles or devices. Without further limitations, elements limited by the wording "include(s) a/an . . . " do not exclude additional identical elements in the processes, methods, articles or devices, including the listed elements.

A linear motor is disposed in an electronic device, and is configured to enable the electronic device to output a vibration sense through vibration. In different scenarios of the electronic device, the linear motor is controlled to vibrate to generate different vibration effects, to enable a user to perceive the vibration sense, thereby prompting the user or giving a feedback on an operation of the user. The details are as follows:

1. Different service scenarios (such as: a time reminder, information reception, an incoming call, an alarm clock, and a game) may correspond to different vibration effects.

2. Serve as a feedback on a touch. For example, touch operations acting on different applications (such as photographing and audio playback) may correspond to different vibration effects. Touch operations acting on different areas of a display screen can also correspond to different vibration effects.

Figure 1A:
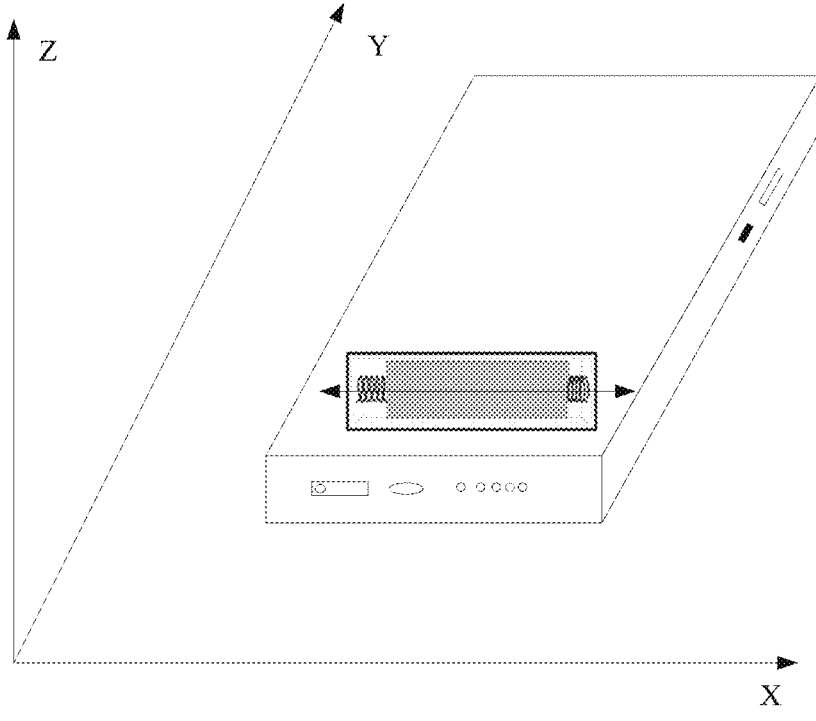
FIG. 1a is a diagram of a structure and application example of an X-axis linear motor.

Linear motors commonly used in the electronic device include an X-axis linear motor (also referred to as a square or transverse linear motor) and a Z-axis linear motor (also referred to as a circular or longitudinal linear motor). FIG. 1a shows a structure and application example of the X-axis linear motor, and FIG. 1b shows a structure and application example of the Z-axis linear motor.

As shown in FIG. 1a, appearance of the X-axis linear motor is strip-shaped or square-shaped. Assuming that an X-axis is a horizontal axis, a Y-axis is a vertical axis, and a Z-axis is a perpendicular axis perpendicular to the X-axis and the Y-axis, a mover of the X-axis linear motor can move in a direction of the X-axis or the Y-axis according to a placement direction, so as to achieve a longer stroke. If the X-axis linear motor is installed along the direction of the X-axis in the electronic device, a vibration sense in the direction of the X-axis can be provided, and if the X-axis linear motor is installed along the direction of the Y-axis in the electronic device, a vibration sense in the direction of the Y-axis can be provided.

Figure 1B:
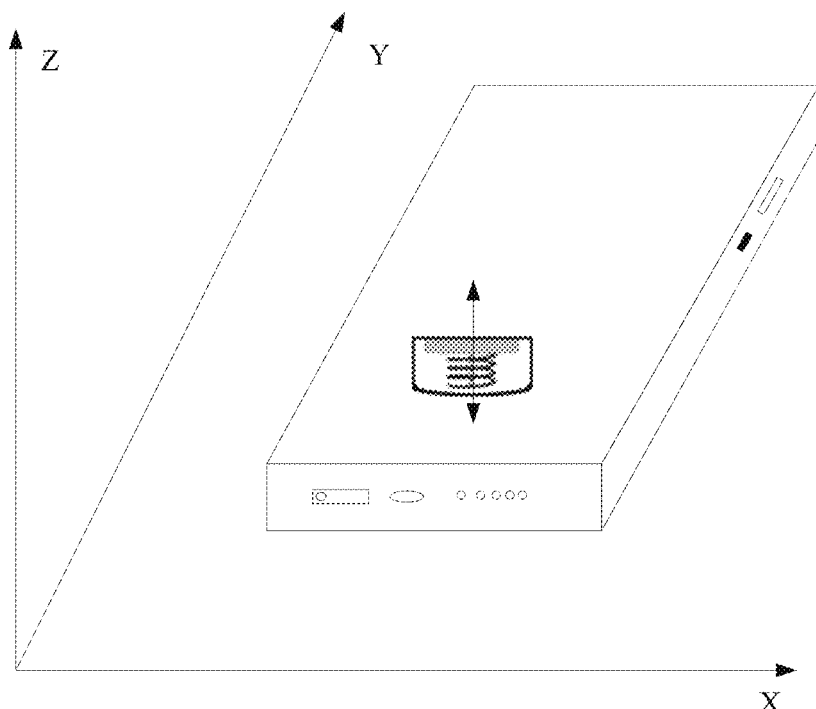
FIG. 1b is a diagram of a structure and application example of a Z-axis linear motor.

As shown in FIG. 1b, appearance of the Z-axis linear motor is cylinder-shaped, and a mover can move in a direction of the Z-axis. Disposing the Z-axis linear motor in the electronic device can bring a vibration sense along a thickness direction of the electronic device.

As one of key elements to control a linear motor to vibrate, a vibration description file is used for describing a vibration waveform of the linear motor, and the vibration waveform indicates various vibration parameters in a vibration process of the motor, such as an amplitude and a frequency.

Figure 2A:
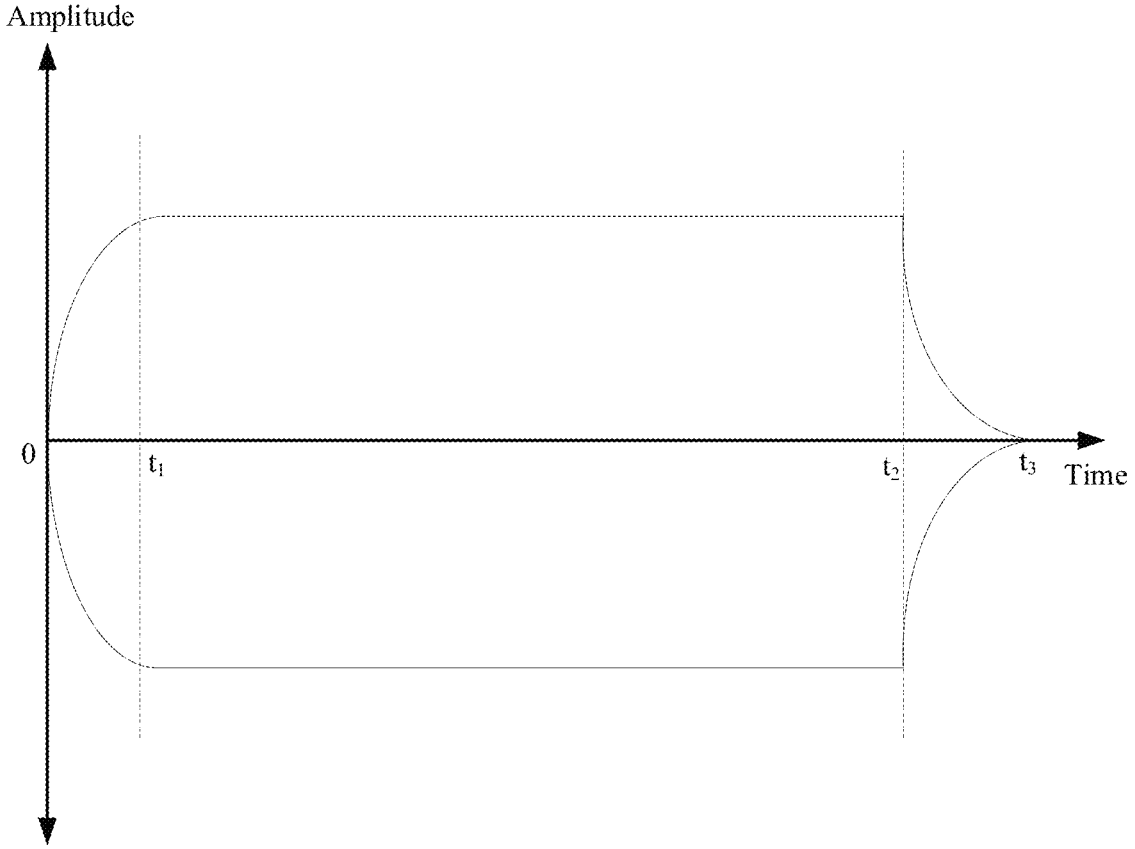
FIG. 2a provides an envelope of a vibration waveform that drives a linear motor to run at a resonant frequency.

According to the vibration waveform described in the vibration description file, if the linear motor is controlled to run at a resonant frequency, which can refer to FIG. 2a, amplitudes of the linear motor within a startup time (0 to $t_1$) and a stop time ($t_2$ to $t_3$) transition smoothly. In this case, the vibration sense brought by the linear motor is smooth, and vibration noise is relatively low.

The resonant frequency of the linear motor is a key parameter for the running of the linear motor. The resonant frequency, also referred to as a resonance frequency, refers to a situation in which a physical system (referring to the linear motor), at a specific frequency, vibrates with a larger amplitude than those at other frequencies, where the specific frequency is referred to as the resonance frequency. At the resonance frequency, a very small driving force can cause the linear motor to vibrate greatly. Therefore, the linear motor is generally driven to run at the resonant frequency.

Figure 2B:
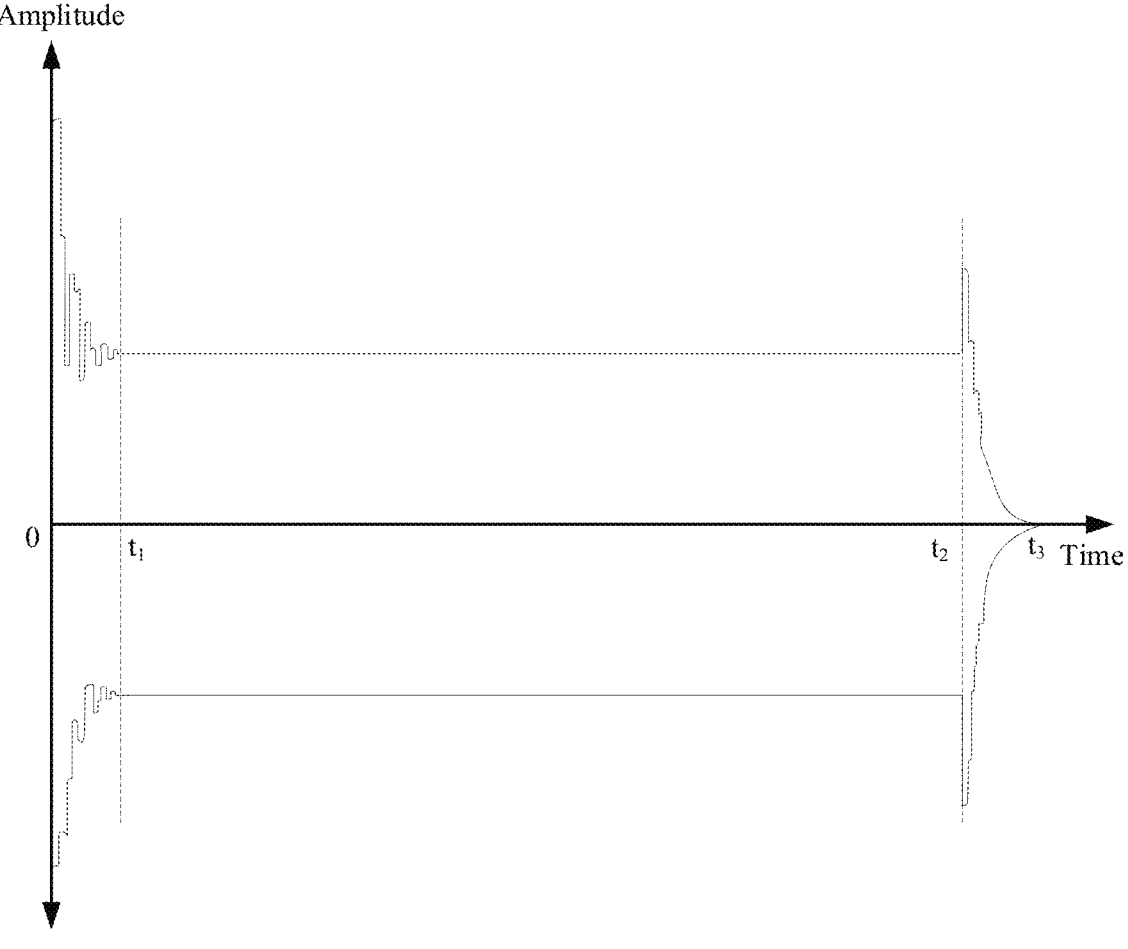
FIG. 2b provides an envelope of a vibration waveform that drives a linear motor to run at a non-resonant frequency.

However, in order to meet a multi-vibration-sense experience need of the user or different vibration sense needs of different applications, it is necessary to use any frequency within a certain frequency range to drive the linear motor to run, which means that the linear motor does not run at the resonant frequency. The caused problem is: with reference to FIG. 2b, the amplitudes of the linear motor are disordered within the startup time (0 to $t_1$) and the stop time ($t_2$ to $t_3$). Such amplitude disorder is referred to as motor overdrive, that is, the vibration sense brought by the linear motor is unsteady and unsmooth, and the vibration noise is relatively high.

Therefore, it is necessary to adjust the vibration waveform described in the vibration description file, so that when the vibration waveform is outputted by the linear motor that implements vibration, the amplitudes of the linear motor are smooth, the vibration sense is steady and smooth, and the noise is relatively low within the startup time and the stop time.

In a processing method for a vibration waveform of a linear motor disclosed in embodiments of this application, the vibration waveform described in a vibration description file is adjusted based on a feature of the linear motor that implements vibration, so that the linear motor that implements the vibration can output smooth amplitudes within a startup time and a stop time, thereby solving an overdrive problem.

The processing method for a vibration waveform of a linear motor disclosed in the embodiments of this application is applicable to an electronic device provided with the linear motor. The electronic device provided with the linear motor can be a device such as a mobile phone, a tablet computer, a desktop computer, a laptop computer, an ultra-mobile personal computer (Ultra-mobile Personal Computer, UMPC), a handhold computer, a notebook, a personal digital assistant (Personal Digital Assistant, PDA), a wearable electronic device, a smart watch, or the like.

Figure 3:
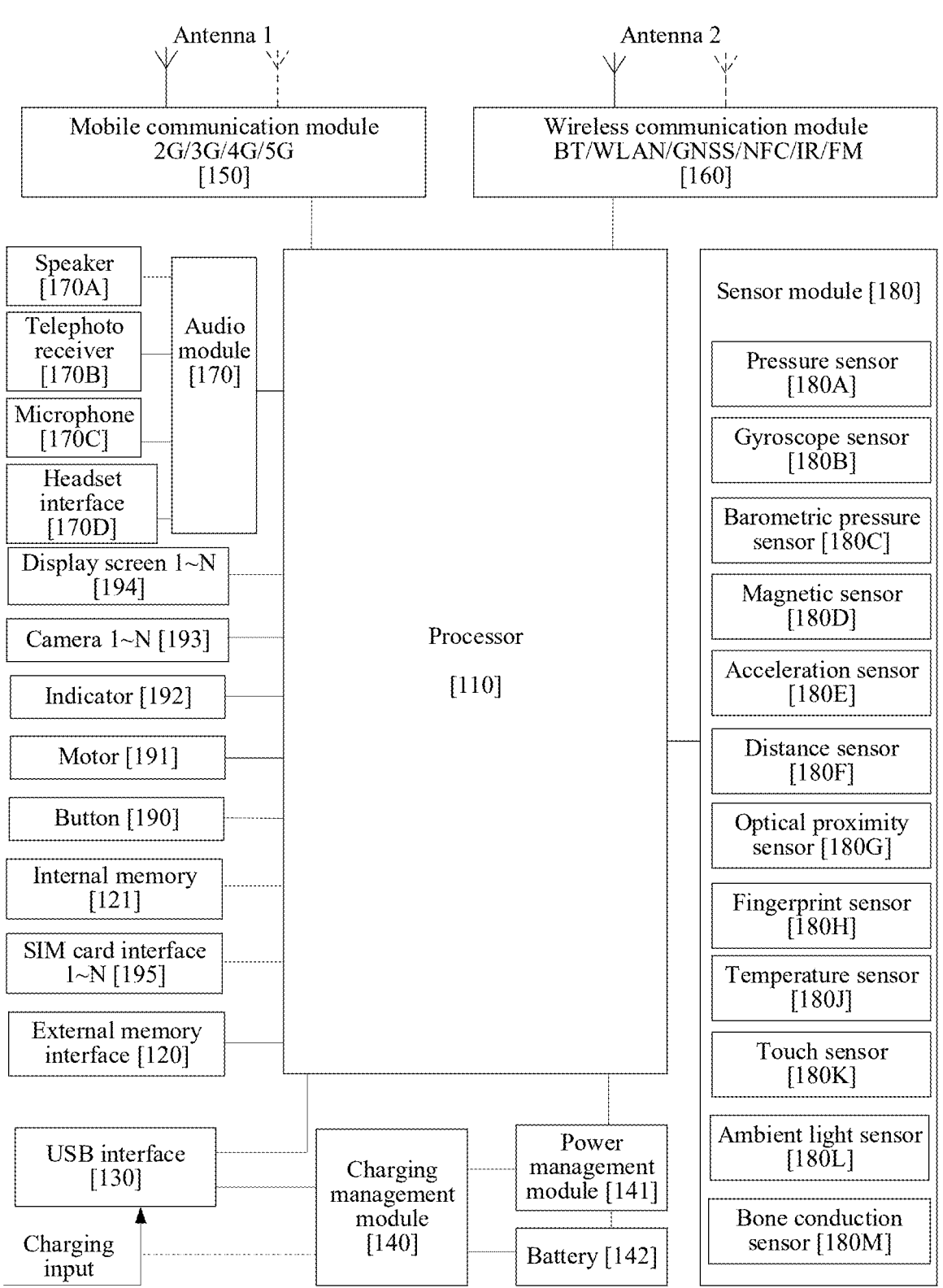
FIG. 3 is a schematic structural diagram of an electronic device according to an embodiment of this application.

The electronic device shown in FIG. 3 includes: a processor 110, an external memory interface 120, an internal memory 121, a universal serial bus (universal serial bus, USB) interface 130, a charging management module 140, a power management module 141, a battery 142, an antenna 1, an antenna 2, a mobile communication module 150, a wireless communication module 160, and an audio module 170, a speaker 170A, a telephone receiver 170B, a microphone 170C, a headset jack 170D, a sensor module 180, a button 190, a motor 191, an indicator 192, a camera 193, a display screen 194, a subscriber identity module (subscriber identity module, SIM) card interface 195, and the like. The sensor module 180 may include a pressure sensor 180A, a gyroscope sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, and a touch sensor 180K, an ambient light sensor 180L, a bone conduction sensor 180M, and the like.

It may be understood that the schematic structure in this embodiment constitutes no specific limitation on the electronic device. In some other embodiments, the electronic device may include more or fewer components than those shown in the figure, or some components may be combined, or some components may be split, or components are arranged in different manners. The components in the figure may be implemented by hardware, software, or a combination of software and hardware.

The processor 110 may include one or more processing units. For example, the processor 110 may include an application processor (application processor, AP), a modem processor, a graphics processing unit (graphics processing unit, GPU), an image signal processor (image signal processor, ISP), a controller, a video codec, a digital signal processor (digital signal processor, DSP), a baseband processor, and/or a neural-network processing unit (neural-network processing unit, NPU). Different processing units may be independent components, or may be integrated into one or more processors.

The controller may be a nerve center and a command center of the electronic device. The controller, according to an instruction operation code and a timing signal, may generate an operation control signal, to complete the control of extracting and executing instructions.

In this embodiment of this application, the processor 110 executes the processing method for a vibration waveform provided in the following embodiments.

A memory may be further disposed in the processor 110, and is configured to store instructions and data. In some embodiments, the memory in the processor 110 is a cache. The memory may store an instruction or data that has just been used or cyclically used by the processor 110. If the processor 110 needs to use the instruction or the data again, the processor may directly invoke the instruction or the data from the memory, to avoid repeated access and reduce a waiting time of the processor 110, thereby improving system efficiency.

In some embodiments, the processor 110 may include one or more interfaces. The interface may include an integrated circuit (inter-integrated circuit, I2C) interface, an integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI), a general-purpose input/output (general-purpose input/output, GPIO) interface, a subscriber identity module (subscriber identity module, SIM) interface, a universal serial bus (universal serial bus, USB) interface, and/or the like.

The I2C interface is a two-way synchronization serial bus, and includes a serial data line (serial data line, SDA) and a serial clock line (serial clock line, SCL). In some embodiments, the processor 110 may include a plurality sets of I2C buses. The processor 110 may be coupled to the touch sensor 180K, a charger, a flash, the camera 193, and the like through different I2C bus interfaces respectively. For example, the processor 110 may be coupled to the touch sensor 180K through the I2C interface, to enable the processor 110 and the touch sensor 180K to communicate with each other through an I2C bus interface, thereby implementing a touch function of the electronic device.

The I2S interface may be used for audio communication. In some embodiments, the processor 110 may include a plurality sets of I2S buses. The processor 110 may be coupled to the audio module 170 through the I2S bus, to implement communication between the processor 110 and the audio module 170. In some embodiments, the audio module 170 may transmit an audio signal to the wireless communication module 160 through the I2S interface, to implement a function of answering a call through a Bluetooth headset.

The PCM interface may also be used for audio communication, and samples, quantizes, and encodes an analog signal. In some embodiments, the audio module 170) and the wireless communication module 160 may be coupled through a PCM bus interface. In some embodiments, the audio module 170 may also transmit an audio signal to the wireless communication module 160 through the PCM interface, to implement a function of answering a call through a Bluetooth headset. Both the I2S interface and the PCM interface may be used for audio communication.

The UART interface is a universal serial data bus used for asynchronous communication. The bus may be a two-way communication bus. The bus converts to-be-transmitted data between serial communication and parallel communication. In some embodiments, the UART interface is generally used for connecting the processor 110 to the wireless communication module 160. For example, the processor 110 communicates with a Bluetooth module in the wireless communication module 160 through the UART interface, to implement a Bluetooth function. In some embodiments, the audio module 170) can transmit an audio signal to the wireless communication module 160 through the UART interface, to implement a function of playing music through a Bluetooth headset.

The MIPI interface may be used for connecting the processor 110 to peripheral devices such as the display screen 194 and the camera 193. The MIPI interface include a camera serial interface (camera serial interface, CSI), a display serial interface (display serial interface, DSI), and the like. In some embodiments, the processor 110) communicates with the camera 193 through the CSI interface, to implement a photographing function of the electronic device. The processor 110 communicates with the display screen 194 through the DSI interface, to implement a display function of the electronic device.

The GPIO interface may be configured through software. The GPIO interface may be configured as a control signal, or may be configured as a data signal. In some embodiments, the GPIO interface may be used for connecting the processor 110 to the camera 193, the display screen 194, the wireless communication module 160, the audio module 170, the sensor module 180, and the like. The GPIO interface may alternatively be configured as the I2C interface, the I2S interface, the UART interface, the MIPI interface, or the like.

The USB interface 130 is an interface that conforms to the USB standard specification, and may be specifically a Mini USB interface, a Micro USB interface, a USB Type C interface, or the like. The USB interface 130 may be used for connecting to the charger to charge the electronic device, may also be used for transmitting data between the electronic device and a peripheral device, and may also be used for connecting to a headset to play audio through the headset. The interface may also be used for connecting to other electronic devices, such as an AR device.

It may be understood that an interface connection relationship between the modules illustrated in this embodiment is merely an example for description, and does not constitute a limitation on a structure of the electronic device. In some other embodiments of this application, the electronic device may also use an interface connection manner different from that in the foregoing embodiment, or a combination of a plurality of interface connection manners.

The charging management module 140 is configured to receive a charging input from a charger. The charger may be a wireless charger or may be a wired charger. In some embodiments of wired charging, the charging management module 140 may receive charging input of a wired charger by using the USB interface 130. In some embodiments of wireless charging, the charging management module 140 may receive wireless charging input by using a wireless charging coil of the electronic device. When charging the battery 142, the charging management module 140 may further supply power to the electronic device by using the power management module 141.

The power management module 141 is configured to connect to the battery 142, the charging management module 140, and the processor 110. The power management module 141 receives an input of the battery 142 and/or the charging management module 140, to supply power to the processor 110, the internal memory 121, the display screen 194, the camera 193, the wireless communication module 160, and the like. The power management module 141 may also be configured to monitor parameters such as battery capacity, a battery cycle count, a battery state of health (electric leakage and impedance). In some other embodiments, the power management module 141 may be alternatively disposed in the processor 110. In some other embodiments, the power management module 141 and the charging management module 140 may be alternatively disposed in a same component.

A wireless communication function of the electronic device may be implemented by using the antenna 1, the antenna 2, the mobile communication module 150, the wireless communication module 160, the modem processor, the baseband processor, and the like.

The antenna 1 and the antenna 2 are configured to transmit and receive an electromagnetic wave signal. Each antenna in the electronic device may be configured to cover one or more communication frequency bands. Different antennas may also be multiplexed to improve utilization of the antennas. For example, an antenna 1 may be multiplexed as a diversity antenna of a wireless local area network. In some embodiments, the antenna may be used in combination with a tuning switch.

The mobile communication module 150 may provide a solution to wireless communication such as 2G/3G/4G/5G applicable to the electronic device. The mobile communication module 150 may include at least one filter, switch, power amplifier, low noise amplifier (low noise amplifier, LNA), and the like. The mobile communication module 150) may receive an electromagnetic wave through the antenna 1, perform processing such as filtering and amplification on the received electromagnetic wave, and transmit a processed electromagnetic wave to the modem processor for demodulation. The mobile communication module 150 may further amplify a signal modulated by the modem processor, and convert the signal into an electromagnetic wave for radiation through the antenna 1. In some embodiments, at least some function modules of the mobile communication module 150 may be disposed in the processor 110. In some embodiments, at least some function modules of the mobile communication module 150 and at least some modules of the processor 110 may be disposed in a same component.

The modem processor may include a modulator and a demodulator. The modulator is used for modulating a to-be-sent low frequency baseband signal into a medium and high frequency signal. The demodulator is used for demodulating the received electromagnetic wave signal into the low frequency baseband signal. Then the demodulator transfers the low frequency baseband signal obtained through demodulation to the baseband processor for processing. The low frequency baseband signal is transmitted to the application processor after being processed by the baseband processor. The application processor outputs a sound signal through an audio device (not limited to the speaker 170A, the telephone receiver 170B, and the like.), or displays an image or a video through the display screen 194. In some embodiments, the modem processor may be an independent device. In some other embodiments, the modem processor may be independent of the processor 110, and may be disposed in a same device as the mobile communication module 150) or other functional modules.

The wireless communication module 160 may provide a solution to wireless communication applicable to the electronic device, for example, a wireless local area network (wireless local area networks, WLAN) (for example, a wireless fidelity (wireless fidelity, Wi-Fi) network), Bluetooth (Bluetooth, BT), a global navigation satellite system (global navigation satellite system, GNSS), frequency modulation (frequency modulation, FM), near field communication (near field communication, NFC), and an infrared (infrared, IR) technology. The wireless communication module 160 may be one or more components into which at least one communication processing module is integrated. The wireless communication module 160 receives an electromagnetic wave through the antenna 2, performs frequency modulation and filtering processing on an electromagnetic wave signal, and sends a processed signal to the processor 110. The wireless communication module 160 may alternatively receive a to-be-sent signal from the processor 110, perform frequency modulation and amplification on the to-be-sent signal, and convert the signal into an electromagnetic wave for radiation by using the antenna 2.

In some embodiments, the antenna 1 and the mobile communication module 150 of the electronic device are coupled, and the antenna 2 and the wireless communication module 160 of the electronic device are coupled, so that the electronic device can communicate with a network and another device by using a wireless communication technology. The wireless communication technology may include a global system for mobile communications (global system for mobile communications, GSM), a general packet radio service (general packet radio service, GPRS), code division multiple access (code division multiple access, CDMA), wideband code division multiple access (wideband code division multiple access, WCDMA), time-division code division multiple access (time-division code division multiple access, TD-SCDMA), long term evolution (long term evolution, LTE), BT, a GNSS, a WLAN, NFC, FM, an IR technology, and/or the like. The GNSS may include a global positioning system (global positioning system, GPS), a global navigation satellite system (global navigation satellite system, GLONASS), and a Beidou navigation satellite system (Beidou navigation satellite system, BDS), a quasi-zenith satellite system (quasi-zenith satellite system, QZSS) and/or a satellite based augmentation system (satellite based augmentation system, SBAS).

The electronic device implements a display function by using the GPU, the display screen 194, the application processor, and the like. The GPU is a microprocessor for image processing, and is connected to the display screen 194 and the application processor. The GPU is configured to perform mathematical and geometric calculations and to render graphics. The processor 110 may include one or more GPUs and execute program instructions to generate or change display information.

The display screen 194 is configured to display an image, a video, and the like. The display screen 194 includes a display panel. The display panel may be a liquid crystal display (liquid crystal display, LCD), an organic light-emitting diode (organic light-emitting diode, OLED), an active-matrix organic light emitting diode (active-matrix organic light emitting diode, AMOLED), a flexible light-emitting diode (flex light-emitting diode, FLED), a Miniled, a MicroLed, a Micro-oled, quantum dot light emitting diodes (quantum dot light emitting diodes, QLED), and the like. In some embodiments, the electronic device may include one or N display screens 194, where N is a positive integer greater than 1.

The display screen 194 of the electronic device may display a series of graphical user interfaces (graphical user interface, GUI), and these GUIs are all home screens of the electronic device. Generally, a size of the display screen 194 of the electronic device is fixed, and only a limited number of controls can be displayed in the display screen 194 of the electronic device. A control is a GUI element, which is a software component included in an application, and controls all data processed by the application and interactive operations regarding all the data. A user can interact with the control through direct manipulation (direct manipulation), so as to read or edit relevant information of the application. In general, the control may include an icon, a button, a menu, a tab, a text box, a dialog box, a status bar, a navigation bar, a Widget, and other visual interface elements. For example, in this embodiment of this application, the display screen 194 may display a virtual button.

The electronic device can implement a photographing function by using the ISP, the camera 193, the video codec, the GPU, the display screen 194, the application processor, and the like.

The ISP is configured to process data fed back by the camera 193. For example, during photographing, a shutter is enabled. Light is transferred to a photosensitive element of the camera through a lens, and an optical signal is converted into an electrical signal. The photosensitive element of the camera transfers the electrical signal to the ISP for processing, and therefore, the electrical signal is converted into an image visible to a naked eye. The ISP may further optimize noise point, brightness, and skin tone algorithms. The ISP may further optimize parameters such as exposure and color temperature of a shooting scene. In some embodiments, the ISP may be disposed in the camera 193.

The camera 193 is configured to capture a static image or a video. An optical image of an object is generated through a lens and is projected onto the photosensitive element. The photosensitive element may be a charge coupled device (charge coupled device, CCD) or a complementary metal-oxide-semiconductor (complementary metal-oxide-semiconductor, CMOS) phototransistor. The photosensitive element converts an optical signal into an electrical signal, and then transmits the electrical signal to the ISP to convert the electrical signal into a digital image signal. The ISP outputs the digital image signal to the DSP for processing. The DSP converts the digital image signal into a standard image signal in RGB and YUV formats. In some embodiments, the electronic device may include 1 or N cameras 193, where N is a positive integer greater than 1.

The digital signal processor is configured to process a digital signal, and in addition to a digital image signal, may further process another digital signal. For example, when the electronic device performs frequency selection, the digital signal processor is configured to perform Fourier transform and the like on frequency energy.

The video codec is configured to compress or decompress a digital video. The electronic device may support one or more video codecs. In this way, the electronic device may play or record videos in a plurality of encoding formats, for example, moving picture experts group (moving picture experts group, MPEG) 1, MPEG 2, MPEG 3, and MPEG 4.

The NPU is a neural-network (neural-network, NN) computing processor, and quickly processes input information by using a biological neural network structure such as a mode of transmission between human-brain nerve cells, and may further constantly perform self-learning. The NPU may be used to implement an application such as intelligent cognition of the electronic device, for example, image recognition, facial recognition, voice recognition, and text understanding.

The external memory interface 120 may be configured to connect to an external storage card such as a micro SD card, to expand a storage capability of the electronic device. The external storage card communicates with the processor 110 by using the external memory interface 120, so as to implement a data storage function, such as storing a file such as music or a video in the external storage card.

The internal memory 121 may be configured to store computer-executable program code, and the executable program code includes an instruction. The processor 110 runs the instruction stored in the internal memory 121, to implement various functional applications and data processing of the electronic device 100. The internal memory 121 may include a program storage area and a data storage area. The program storage area may store an operating system, an application required by at least one function (such as a voice playing function and an image playing function), and the like. The data storage area may store data (such as audio data and an address book) created during use of the electronic device 100, and the like. In addition, the internal memory 121 may include a high-speed random access memory, and may also include a non-volatile memory, such as at least one magnetic disk storage device, a flash memory device, a universal flash storage (universal flash storage, UFS), and the like.

In this embodiment of this application, the instruction stored in the internal memory 121 is used for performing the processing method for a vibration waveform. The processor 110 may adjust the vibration waveform described in the vibration description file by executing the instruction stored in the internal memory 121, so as to ensure that the amplitudes of the linear motor within the startup time and the stop time are smoothly transitioned, thereby solving the over-drive problem.

The electronic device may implement an audio function by using the audio module 170, the speaker 170A, the telephone receiver 170B, the microphone 170C, the headset jack 170D, the application processor, and the like, such as music playing or recording.

The audio module 170 is configured to convert digital audio information into an analog audio signal output, and is further configured to convert an analog audio input into a digital audio signal. The audio module 170 may be further configured to encode and decode an audio signal. In some embodiments, the audio module 170) may be disposed in the processor 110, or some function modules of the audio module 170 are disposed in the processor 110.

The speaker 170A, also referred to as a "horn", is configured to convert an audio electrical signal into a sound signal. Music can be listened to or a hands-free call can be answered by using the speaker 170A in the electronic device.

The telephone receiver 170B, also referred to as a "receiver", is configured to convert an audio electrical signal into a sound signal. When the electronic device is used to answer a call or receive voice information, the telephone receiver 170B may be put close to a human ear, to receive the voice information.

The microphone 170C, also referred to as a "mike", or a "mic", is configured to convert a sound signal into an electrical signal. When making a call or sending voice information, a user may speak with the mouth approaching the microphone 170C, to input a sound signal to the microphone 170C. At least one microphone 170C may be disposed in the electronic device. In some other embodiments, two microphones 170C may be disposed in the electronic device, to collect a sound signal and implement a noise reduction function. In some other embodiments, three, four, or more microphones 170C may be alternatively disposed in the electronic device, to collect a sound signal, implement noise reduction, recognize a sound source, implement a directional recording function, and the like.

The headset jack 170D is configured to connect to a wired headset. The headset jack 170D may be a USB interface 130, or may be a 3.5 mm open mobile terminal platform (open mobile terminal platform, OMTP) standard interface or cellular telecommunications industry association of the USA (cellular telecommunications industry association of the USA, CTIA) standard interface.

The pressure sensor 180A is configured to sense a pressure signal, and may convert the pressure signal into an electrical signal. In some embodiments, the pressure sensor 180A may be disposed in the display screen 194. There are a plurality of types of pressure sensors 180A, for example, a resistive pressure sensor, an inductive pressure sensor, and a capacitive pressure sensor. The capacitive pressure sensor may include at least two parallel plates having conductive materials. When force is exerted on the pressure sensor 180A, capacitance between electrodes changes. The electronic device determines strength of pressure based on a change of the capacitance. When a touch operation is performed on the display screen 194, the electronic device detects strength of the touch operation by using the pressure sensor 180A. The electronic device may further calculate a position of the touch based on a detection signal of the pressure sensor 180A. In some embodiments, touch operations that are performed on a same touch position but have different touch operation strength may correspond to different operation instructions. For example, when a touch operation whose touch operation strength is less than a first pressure threshold is performed on an SMS message application icon, an instruction of checking an SMS message is executed. When a touch operation whose touch operation strength is greater than or equal to the first pressure threshold is performed on the SMS message application icon, an instruction of creating a new SMS message is executed.

The gyroscope sensor 180B may be configured to determine a motion attitude of the electronic device. In some embodiments, angular velocities of the electronic device around three axes (that is, an x axis, a y axis, and a z axis) may be determined through the gyroscope sensor 180B. The gyroscope sensor 180B may be used for image stabilization during photographing. For example, when the shutter is pressed, the gyroscope sensor 180B detects an angle at which the electronic device jitters, and calculates, based on the angle, a distance for which a lens module needs to compensate, and allows the lens to cancel the jitter of the electronic device through reverse motion, thereby implementing image stabilization. The gyroscope sensor 180B may also be used in navigation and a motion sensing game scene.

The barometric pressure sensor 180C is configured to measure barometric pressure. In some embodiments, the electronic device calculates an altitude by using a barometric pressure value measured by the barometric pressure sensor 180C, to assist in positioning and navigation.

The magnetic sensor 180D includes a Hall effect sensor. The electronic device may detect opening and closing of a flip cover or a leather case by using the magnetic sensor 180D. In some embodiments, when the electronic device is a clamshell phone, the electronic device may detect opening and closing of a flip cover based on the magnetic sensor 180D. Further, based on a detected opening or closing state of the leather case or a detected opening or closing state of the flip cover, a feature such as automatic unlocking of the flip cover is set.

The acceleration sensor 180E may detect magnitudes of acceleration of the electronic device in various directions (generally on three axes). When the electronic device is stationary, a magnitude and a direction of gravity may be detected. The acceleration sensor may be further configured to recognize a posture of the electronic device, and is applied to switching between landscape orientation and portrait orientation, and applied to an application such as a pedometer.

The distance sensor 180F is configured to measure a distance. The electronic device may measure a distance through infrared or laser. In some embodiments, in a photographing scene, the electronic device may measure a distance by using the distance sensor 180F, to implement quick focusing.

The optical proximity sensor 180G may include, for example, a light-emitting diode (LED) and an optical detector such as a photodiode. The light emitting diode may be an infrared light emitting diode. The electronic device emits infrared light by using the light-emitting diode. The electronic device detects infrared reflected light from a nearby object by using the photodiode. When detecting sufficient reflected light, the electronic device may determine that there is an object near the electronic device. When detecting insufficient reflected light, the electronic device may determine that there is no object near the electronic device. The electronic device may detect, by using the optical proximity sensor 180G, that a user holds the electronic device close to an ear for a call, so that automatic screen-off is implemented to achieve power saving. The optical proximity sensor 180G may alternatively be used in a leather case mode or a pocket mode to automatically unlock or lock the screen.

The ambient light sensor 180L is configured to sense luminance of ambient light. The electronic device may adaptively adjust a luminance of the display screen 194 according to perceived brightness of the ambient light. The ambient light sensor 180L may be further configured to automatically adjust white balance during photo taking. The ambient light sensor 180L may further cooperate with the optical proximity sensor 180G to detect whether the electronic device is in a pocket, so as to prevent an accidental touch.

The fingerprint sensor 180H is configured to collect a fingerprint. The electronic device may implement fingerprint unlock, application lock accessing, fingerprint photographing, fingerprint-based call answering, and the like by using a feature of the collected fingerprint.

The temperature sensor 180J is configured to detect a temperature. In some embodiments, the electronic device executes a temperature processing policy by using the temperature detected by the temperature sensor 180J. For example, when the temperature reported by the temperature sensor 180J exceeds a threshold, the electronic device reduces performance of a processor near the temperature sensor 180J, to reduce power consumption and implement heat protection. In some other embodiments, when the temperature is lower than another threshold, the electronic device heats the battery 142, to avoid an abnormal shutdown of the electronic device caused by a low temperature. In some other embodiments, when the temperature is lower than still another threshold, the electronic device boosts an output voltage of the battery 142, to avoid an abnormal shutdown caused by a low temperature.

The touch sensor 180K is also referred to as a "touch device". The touch sensor 180K may be disposed on the display screen 194. The touch sensor 180K and the display screen 194 form a touchscreen, which is also referred to as a "touch control screen". The touch sensor 180K is configured to detect a touch operation performed on or near the touch sensor 180K. The touch sensor may transmit the detected touch operation to the application processor, to determine a touch event type. The touch sensor may provide a visual output related to the touch operation by using the display screen 194. In some other embodiments, the touch sensor 180K may be alternatively disposed on a surface of the electronic device, and is located on a position different from that of the display screen 194.

The bone conduction sensor 180M may obtain a vibration signal. In some embodiments, the bone conduction sensor 180M may obtain a vibration signal of a vibration bone of a human vocal-cord part. The bone conduction sensor 180M may alternatively contact a human pulse, and receive a blood pressure beating signal. In some embodiments, the bone conduction sensor 180M may be alternatively disposed in a headset, to form a bone conduction headset. The audio module 170 may obtain a voice signal through parsing based on the vibration signal, of the vibration bone of the vocal-cord part, that is obtained by the bone conduction sensor 180M, to implement a voice function. The application processor may parse heart rate information based on the blood pressure beating signal obtained by the bone conduction sensor 180M, to implement a heart rate detection function.

The button 190 includes a power button, a volume button, and the like. The button 190 may be a mechanical button, or a touch-type button. The electronic device may receive a button input, and generate a button signal input related to user setting and function control of the electronic device.

The motor 191 may generate a vibration prompt. The motor 191 may be configured to provide a vibration prompt for an incoming call, and may be further configured to provide a touch vibration feedback. For example, touch operations performed on different applications (for example, photo taking and audio playing) may correspond to different vibration feedback effects. For touch operations performed on different regions of the flexible screen 194, the motor 191 may also correspond to different vibration feedback effects. Different application scenarios (for example, a time reminder, information reception, an alarm clock, and a game) may also correspond to different vibration feedback effects. A touch vibration feedback effect may be further customized.

In this embodiment of this application, the motor 191 may use various linear motors, and the processor 110 executes a driver of the linear motor to drive the linear motor to run. In addition, a processing solution for a vibration waveform involved when the driver of the linear motor drives the linear motor to run is the same as the processing method for a vibration waveform provided in the following embodiments of this application.

The indicator 192 may be an indicator light, may be configured to indicate a charging state and a battery change, and may be further configured to indicate a message, a missed call, a notification, and the like.

The SIM card interface 195 is configured to connect to a SIM card. The SIM card may be inserted into the SIM card interface 195 or unplugged from the SIM card interface 195, to come into contact with or be separated from the electronic device. The electronic device may support one or N SIM card interfaces, and N is a positive integer greater than 1. The SIM card interface 195 may support a Nano SIM card, a Micro SIM card, a SIM card, and the like. A plurality of cards may be simultaneously inserted into the same SIM card interface 195. Types of the plurality of cards may be the same or different. The SIM card interface 195 may also be compatible with different types of SIM cards. The SIM card interface 195 may also be compatible with an external storage card. The electronic device interacts with the network by the SIM card to implement functions such as call and data communication. In some embodiments, the electronic device uses an eSIM, that is, an embedded SIM card. The eSIM card may be embedded in the electronic device and cannot be separated from the electronic device.

Figure 4A:
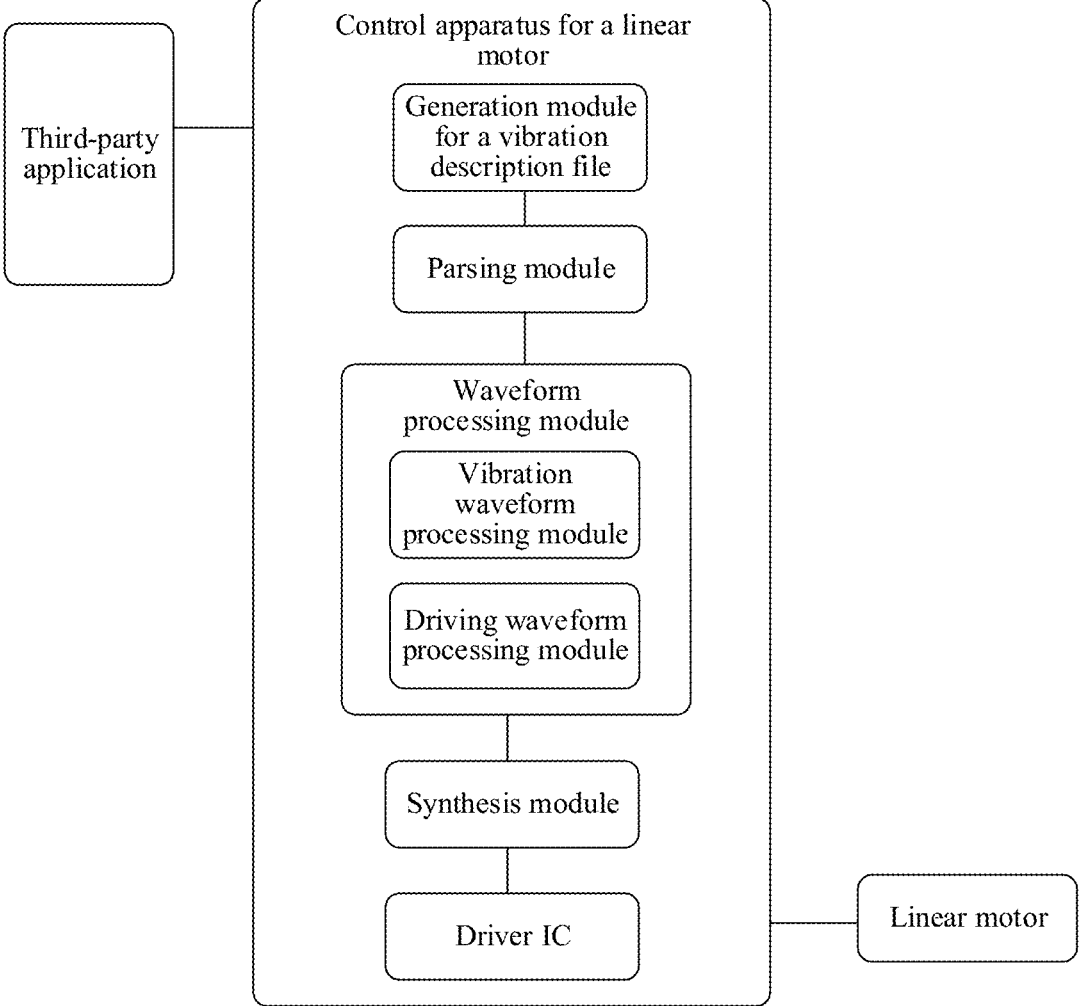
FIG. 4a is an exemplary diagram of a software architecture to which a vibration waveform adjustment method for a linear motor according to an embodiment of this application is applicable.
Figure 4B:
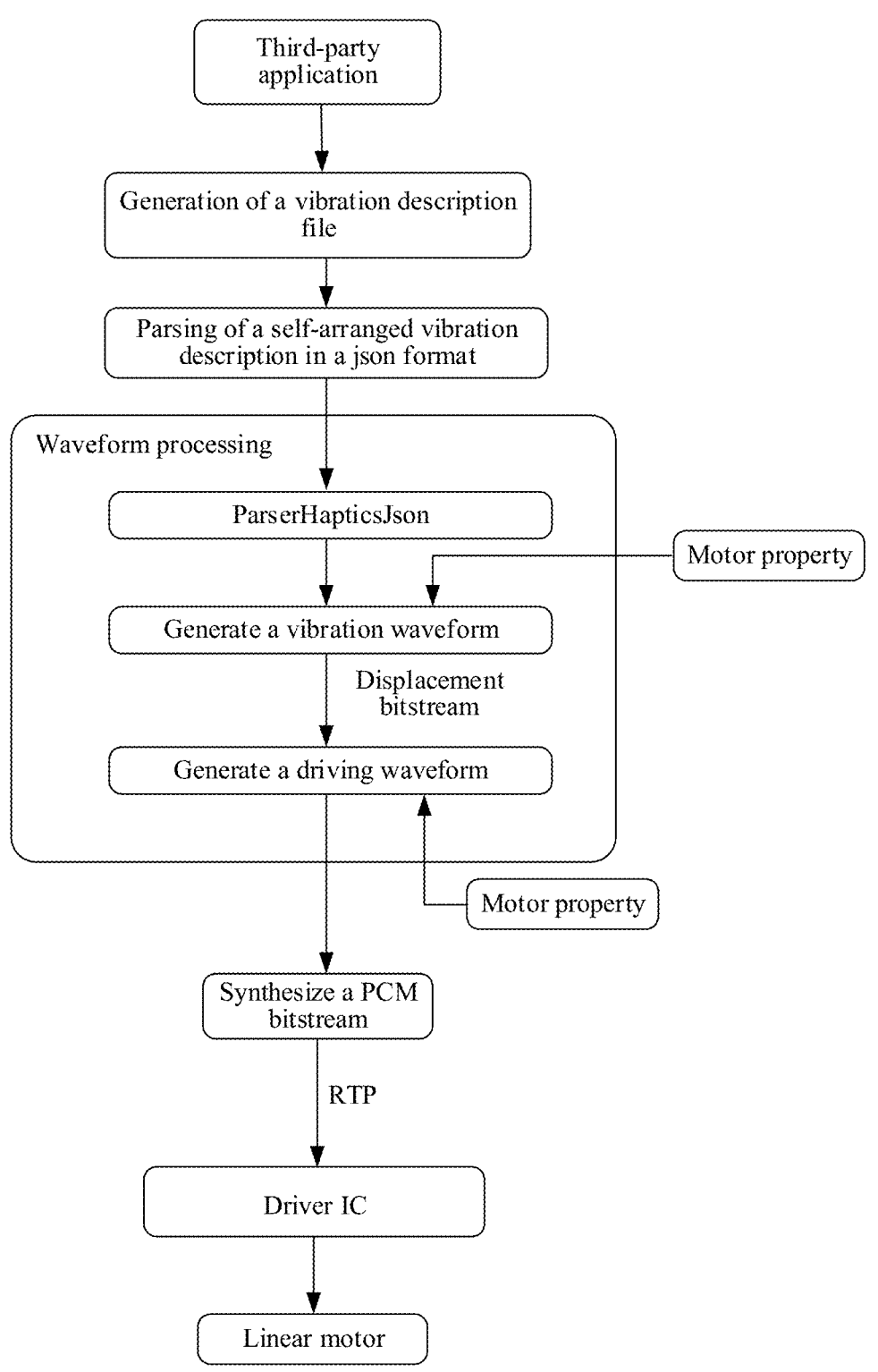

Further, FIG. 4*a* is an example of a software architecture to which the technical solutions disclosed in the embodiments of this application are applicable, and the following can be known from content of FIG. 4*b*.

A generation module (which may interact with a third-party application) for a vibration description file is configured to generate the vibration description file; a parsing module is configured to parse the vibration description file to obtain a file in the json format for describing a vibration waveform; and a waveform processing module is configured to perform a waveform processing operation on the file in the json format. Specifically, a vibration waveform processing module is first configured to perform an operation by using a resultant motor displacement algorithm and generate the vibration waveform in the form of a displacement bitstream according to the file in the json format and properties of a motor, and a driving waveform processing module is then configured to perform an inverse solution operation on the vibration waveform and the properties of the motor by using an inverse solution motor voltage driving algorithm, so as to obtain a driving waveform.

The driving waveform obtained after the waveform processing module performs the waveform processing operation is synthesized by a synthesis module to obtain an audio bitstream in a pulse code modulation (Pulse Code Modulation, PCM) format or in other formats. The audio bitstream is transmitted to an integrated circuit (Integrated Circuit, IC) by using a real-time transport protocol (Real-time Transport Protocol, RTP) or other protocols, and finally acts on the linear motor to control the linear motor to run.

With reference to the structure of the foregoing electronic device, the software architecture shown in FIG. 4*a* may be stored in the internal memory 121, and invoked by the processor 110 to implement the process described in FIG. 4*b*.

The processing method for a vibration waveform of a linear motor described in the embodiments of this application is applicable to the vibration waveform processing module in FIG. 4*a*. The following describes the processing method for a vibration waveform of a linear motor in detail.

Figure 5A:
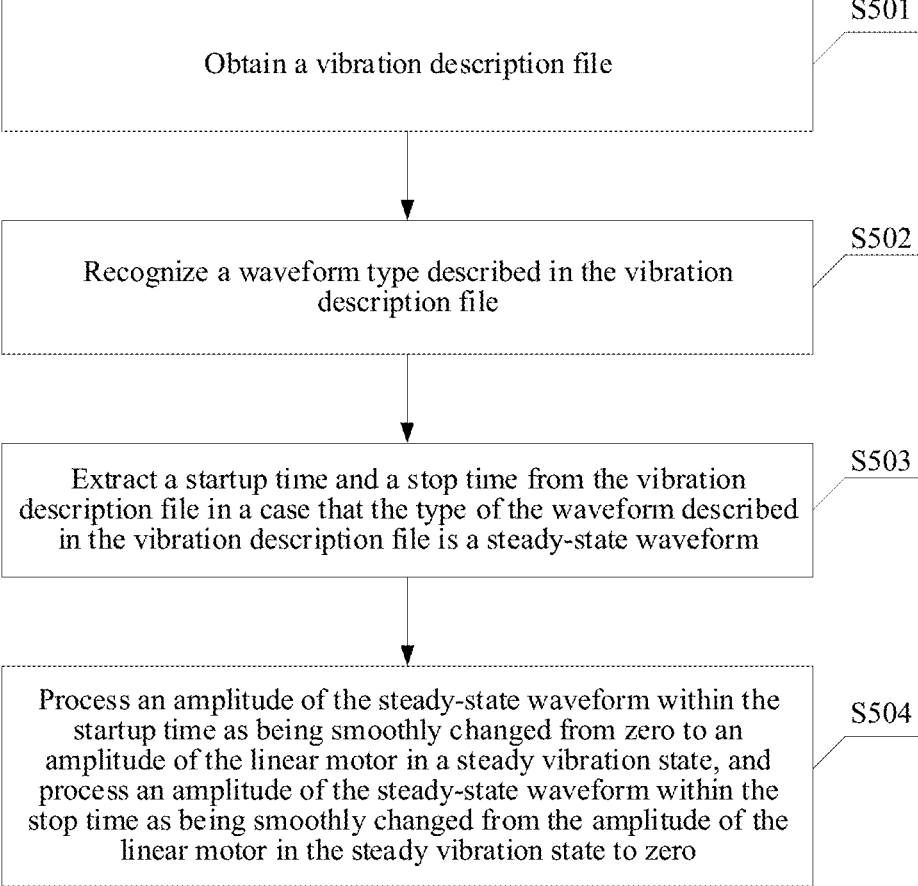
FIG. 5a is a flowchart of a processing method for a vibration waveform according to an embodiment of this application.

With reference to FIG. 5*a*, this application provides a processing method for a vibration waveform, applicable to an electronic device including a linear motor. The processing method for a vibration waveform includes:

S501. Obtain a vibration description file.

The vibration description file includes a variety of vibration parameters. By analyzing the vibration description file, each vibration parameter included in the vibration description file can be obtained, and a vibration waveform of the linear motor can be generated by using the vibration parameters. The vibration waveform of the linear motor can be understood as a displacement bitstream, which reflects displacement of the linear motor at different time points.

As mentioned above, a mover of an X-axis linear motor can move in a direction of an X-axis or a Y-axis, and a mover of a Z-axis linear motor can move in a direction of a Z-axis. Therefore, regardless of the type of a linear motor, running of the linear motor driven by a waveform refers to the running of the mover of the linear motor on a corresponding axis (X-axis, Y-axis, or Z-axis). An expression form of the mover moving on the corresponding axis is displacement changes of the mover along the corresponding axis at different moments, and a vibration sense felt by a user is brought through the displacement changes of the mover at the different moments.

The vibration parameters in the vibration description file may include, but are not limited to: intensity, acutance (also referred to as frequency), a waveform type, a startup time, and a stop time.

S502. Recognize a waveform type described in the vibration description file.

The vibration parameters in the vibration description file include the waveform type. By analyzing the waveform type, it can be determined whether the vibration description file describes a steady-state waveform or a transient waveform.

It may be understood that the steady-state waveform is a vibration waveform that drives the linear motor to go through a rising phase, a steady vibration phase, and a stop phase. The rising phase, the steady vibration phase, and the stop phase are three phases that the linear motor experiences from the beginning of the vibration to the end of the vibration. In the rising phase, the vibration form of the linear motor is expressed as free damped vibration accompanied by forced vibration; in the steady vibration phase, the vibration form of the linear motor is expressed as constant-amplitude steady-state forced vibration; in the stop phase, the vibration form of the linear motor is expressed as free damped vibration.

The transient waveform is a vibration waveform that drives the linear motor to merely go through the rising phase.

S503. Extract a startup time and a stop time from the vibration description file in a case that the waveform type described in the vibration description file is a steady-state waveform.

As mentioned above, when the linear motor runs at a non-resonant frequency, the amplitudes within the startup time and stop time are disordered, and an overdrive problem exists. Therefore, it is necessary to acquire the startup time and the stop time described by the vibration parameters in the vibration description file.

The startup time and the stop time are both time periods. The startup time is the time between the time point when the linear motor starts to run and the time point when the linear motor is in a steady vibration state; and the stop time is the time between the time point when the linear motor is in the steady vibration state and the time point when the linear motor stops running.

S504. Process an amplitude of the steady-state waveform within the startup time as being smoothly changed from zero to an amplitude of the linear motor in a steady vibration state, and process an amplitude of the steady-state waveform within the stop time as being smoothly changed from the amplitude of the linear motor in the steady vibration state to zero.

The amplitude of the steady-state waveform of the linear motor within the startup time is processed as being smoothly changed from zero to the amplitude of the linear motor in the steady vibration state; and the amplitude of the steady-state waveform of the linear motor within the stop time is processed as being smoothly changed from the amplitude of the linear motor in the steady vibration state to zero, so as to ensure that when the linear motor runs with the processed steady-state waveform, the amplitudes outputted within the startup time and the stop time transition smoothly, the amplitudes will not be disordered, a vibration sense brought by the linear motor is steady and smooth, and vibration noise is low.

Figure 5B:
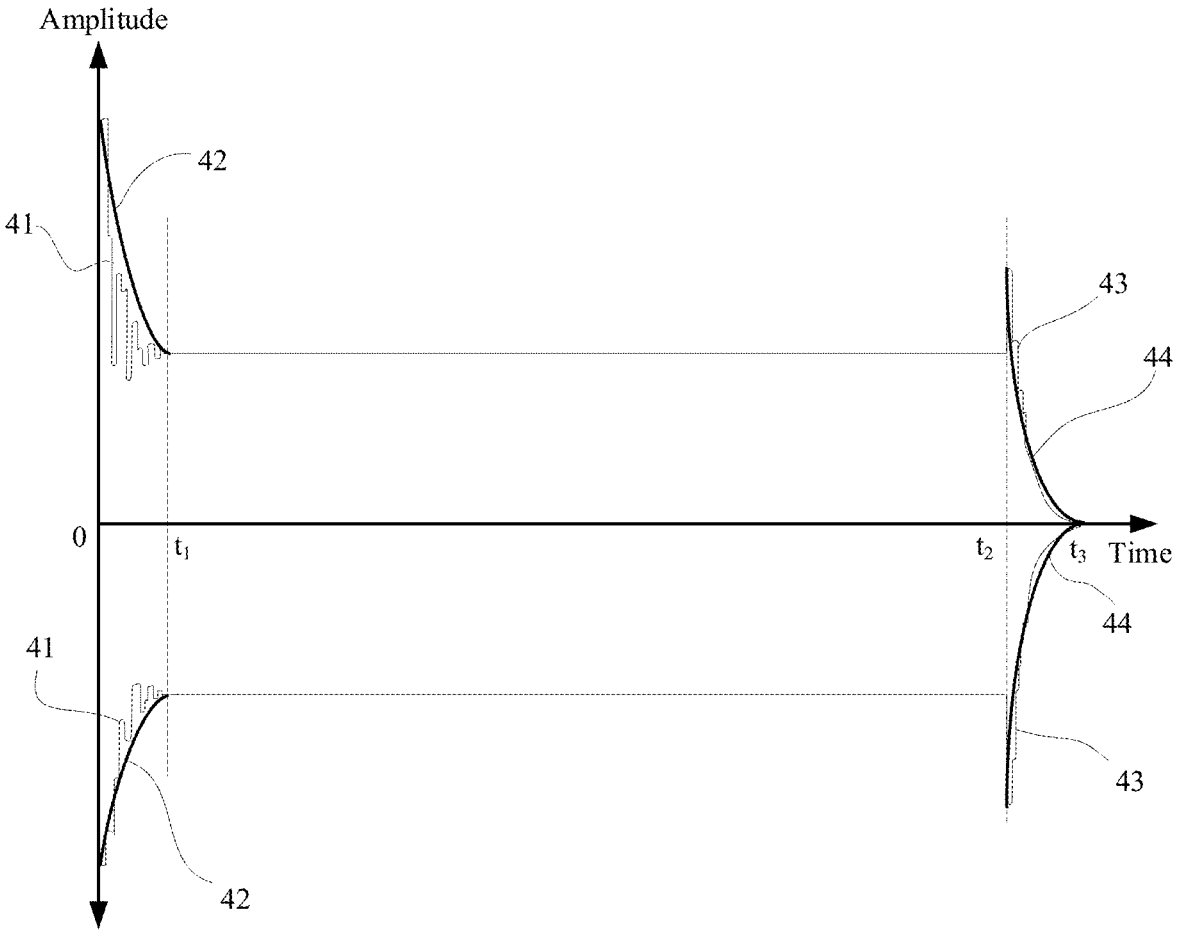
FIG. 5b is a display diagram of adjusting a vibration waveform of a linear motor according to an embodiment of this application.

The smooth change provided in the above content can be understood as a smooth transition of the amplitude of the linear motor from zero to the amplitude in the steady vibration state within the startup time, and a smooth transition of the amplitude of the linear motor from the amplitude in the steady vibration state to zero within the stop time. Referring to FIG. 5b, an original vibration waveform 41 of the startup time (0 to $t_1$) is smoothed to obtain a vibration waveform 42. Similarly, an original vibration waveform 43 of the stop time ($t_2$ to $t_3$) is smoothed to obtain a vibration waveform 44.

As mentioned above, the vibration description file is used to generate the vibration waveform of the linear motor. The vibration waveform is a displacement bitstream that reflects the displacement of the linear motor at different time points. In addition, the displacement of the linear motor at each time point is equivalent in concept to the amplitude of the linear motor at each time point, so adjusting the amplitude of the steady-state waveform according to step S504 is to adjust the displacement at each time point within the startup time and the stop time in the vibration description file.

In a possible implementation, the smooth change can be made in the following two manners:

The first one is to superimpose cosine waveforms on steady-state vibration waveforms within the startup time and the stop time of the linear motor.

The cosine waveforms are superimposed on the steady-state vibration waveforms of the linear motor within the startup time and the stop time, and values of the cosine waveforms at each time point are used to offset overly sharp values in the steady-state vibration waveforms of the linear motor within the startup time and the stop time.

Two cosine waveforms are included. One cosine waveform has a same duration as that of the startup time and includes a same number of waveform values as the amplitude values of a plurality of time points included in the startup time. The waveform values of the cosine waveform are in an opposite direction to the amplitude values at peaks of waveforms within the startup time and in a same direction as the amplitude values at troughs of the waveforms within the startup time, ensuring that the waveforms within the startup time undergo peak load shaving. Similarly, the other cosine waveform has a same duration as that of the stop time, and a value of each time point of the cosine waveform is in an opposite direction to the amplitude values at peaks of waveforms within the stop time and in a same direction as the amplitude values at troughs of the waveforms within the stop time, ensuring that the waveforms within the stop time undergo peak load shaving.

The second one is to process the steady-state vibration waveforms within the startup time and the stop time of the linear motor by using an ascent algorithm.

The ascent algorithm is an algorithm that makes a waveform look like an ascent. Processing with the ascent algorithm can be understood by multiplying the amplitudes of the steady-state waveforms of the linear motor within the startup time and the stop time by a coefficient. Certainly, within the startup time and the stop time, the coefficient by which the amplitude of the steady-state waveform at each time point is multiplied also changes smoothly.

Figure 6:
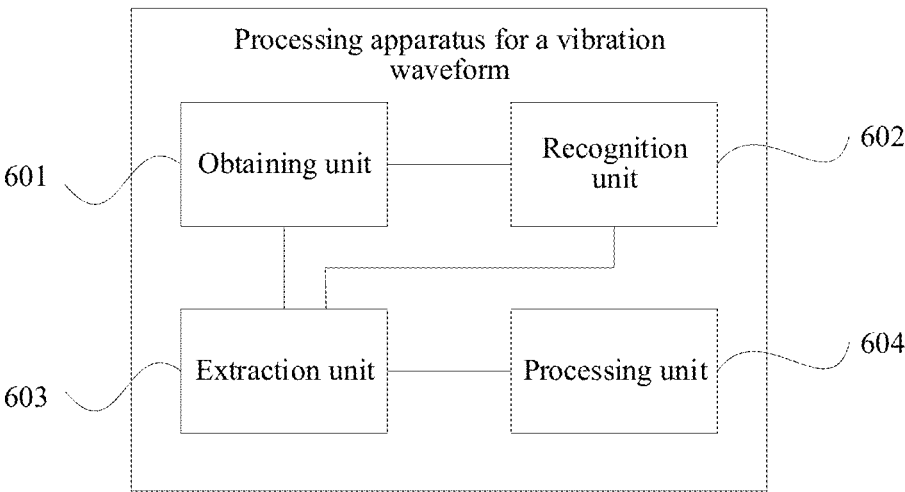
FIG. 6 is a schematic structural diagram of a processing apparatus for a vibration waveform according to an embodiment of this application.

With reference to FIG. 6, an embodiment of this application provides a processing apparatus for a vibration waveform, including:

an obtaining unit 601, configured to obtain a vibration description file;

a recognition unit 602, configured to recognize a waveform type described in the vibration description file;

an extraction unit 603, configured to extract a startup time and a stop time from the vibration description file in a case that the waveform type described in the vibration description file is a steady-state waveform; and a processing unit 604, configured to process an amplitude of the steady-state waveform within the startup time as being smoothly changed from zero to an amplitude of the linear motor in a steady vibration state, and process the amplitude of the steady-state waveform within the stop time as being smoothly changed from the amplitude of the linear motor in the steady vibration state to zero.

It should be noted that, in the processing apparatus for a vibration waveform provided in this embodiment, when the recognition unit 602 recognizes that the waveform described in the vibration description file is the steady-state waveform, the processing unit 604 processes the amplitude of the linear motor within the startup time as being smoothly changed from zero to the amplitude of the linear motor in the steady vibration state, and processes the amplitude of the linear motor within the stop time as being smoothly changed from the amplitude of the linear motor in the steady vibration state to zero, which can control the linear motor to run smoothly within the startup time and the stop time, thereby overcoming the overdrive problem.

Optionally, in another embodiment of this application, the processing unit 604, in a case of processing the amplitude of the steady-state waveform within the startup time as being smoothly changed from zero to the amplitude of the linear motor in the steady vibration state, is configured to:

superimpose a cosine waveform on the steady-state waveform within the startup time, so that the amplitude within the startup time smoothly transitions from zero to the steady-state waveform with the amplitude of the linear motor in the steady vibration state;

or process the steady-state waveform within the startup time by using an ascent algorithm, so that the amplitude within the startup time smoothly transitions from zero to the steady-state waveform with the amplitude of the linear motor in the steady vibration state.

Optionally, in another embodiment of this application, the processing unit 604, in a case of processing the amplitude of the steady-state waveform within the stop time as being smoothly changed from the amplitude of the linear motor in the steady vibration state to zero, is configured to:

superimpose the cosine waveform on the steady-state waveform within the stop time, so that the amplitude within the stop time smoothly transitions from the amplitude of the linear motor in the steady vibration state to the steady-state waveform of zero;

or process the steady-state waveform within the stop time by using the ascent algorithm, so that the amplitude within the stop time smoothly transitions from the amplitude of the linear motor in the steady vibration state to the steady-state waveform of zero.

In the processing apparatus for a vibration waveform provided by the above-mentioned several embodiments of this application, for specific working processes of the obtaining unit 601, the recognition unit 602, the extraction unit 603, and the processing unit 604, reference can be made to the content of the corresponding method embodiments, which is not repeated herein again.

Another embodiment of this application provides a readable storage medium, instructions in the readable storage medium, when executed by a processor of an electronic device, causing the electronic device to implement the processing method for a vibration waveform according to any one of the foregoing embodiments.

Optionally, the readable storage medium may be a non-transitory computer-readable storage medium, for example, the non-transitory computer-readable storage medium may be a ROM, a random access memory (RAM), a CD-ROM, a magnetic tape, a floppy disk, an optical data storage device, or the like.

What is claimed is:

1. A processing method for a vibration waveform applicable to an electronic device that comprises a linear motor, the method comprising:

obtaining a vibration description file;

recognizing a waveform type described in the vibration description file;

determining a startup time and a stop time from the vibration description file in a case that the waveform type described in the vibration description file is a steady-state waveform;

adjusting an amplitude of an original steady-state waveform described in the vibration description file by:

adjusting an amplitude of the original steady-state waveform within the startup time as being smoothly changed from zero to an amplitude of the linear motor in a steady vibration state, including:

superimposing a first cosine waveform on the original steady-state waveform within the startup time, wherein the first cosine waveform has a same duration as that of the startup time, and adjusting an amplitude of the original steady-state waveform within the stop time as being smoothly changed from the amplitude of the linear motor in the steady vibration state to zero;

obtaining a driving waveform based on an adjusted steady-state waveform; and controlling vibration of the linear motor of the electronic device based on the driving waveform to reduce noise within the startup time and the stop time.

2. The processing method for a vibration waveform according to claim 1, wherein by superimposing the first cosine waveform on the original steady-state waveform within the startup time, the amplitude of the adjusted steady-state waveform within the startup time smoothly transitions from zero to the amplitude of the linear motor in the steady vibration state.

3. The processing method for a vibration waveform according to claim 1, wherein the adjusting an amplitude of the original steady-state waveform within the startup time as being smoothly changed from zero to an amplitude of the linear motor in a steady vibration state comprises:

adjusting the original steady-state waveform within the startup time by using an ascent algorithm, so that the amplitude of the adjusted steady-state waveform within the startup time smoothly transitions from zero to the amplitude of the linear motor in the steady vibration state.

4. The processing method for a vibration waveform according to claim 1, wherein the adjusting an amplitude of the original steady-state waveform within the stop time as being smoothly changed from the amplitude of the linear motor in the steady vibration state to zero comprises:

superimposing a cosine waveform on the original steady-state waveform within the stop time, so that the amplitude of the adjusted steady-state waveform within the stop time smoothly transitions from the amplitude of the linear motor in the steady vibration state to zero.

5. The processing method for a vibration waveform according to claim 1, wherein the adjusting an amplitude of the original steady-state waveform within the stop time as being smoothly changed from the amplitude of the linear motor in the steady vibration state to zero comprises:

adjusting the original steady-state waveform within the stop time by using an ascent algorithm, so that the amplitude of the adjusted steady-state waveform within the stop time smoothly transitions from the amplitude of the linear motor in the steady vibration state to zero.

6. A non-transitory machine-readable storage medium having instructions stored therein, which when executed by a processor, cause an electronic device that comprises a linear motor to perform operations for a vibration waveform, the operations comprising:

obtaining a vibration description file;

recognizing a waveform type described in the vibration description file;

determining a startup time and a stop time from the vibration description file in a case that the waveform type described in the vibration description file is a steady-state waveform;

adjusting an amplitude of an original steady-state waveform described in the vibration description file by:

adjusting an amplitude of the original steady-state waveform within the startup time as being smoothly changed from zero to an amplitude of the linear motor in a steady vibration state, including:

superimposing a first cosine waveform on the original steady-state waveform within the startup time, wherein the first cosine waveform has a same duration as that of the startup time, and adjusting the amplitude of the original steady-state waveform within the stop time as being smoothly changed from the amplitude of the linear motor in the steady vibration state to zero;

obtaining a driving waveform based on an adjusted steady-state waveform; and controlling vibration of the linear motor of the electronic device based on the driving waveform to reduce noise within the startup time and the stop time.

7. The non-transitory machine-readable storage medium according to claim 6, wherein by superimposing the first cosine waveform on the original steady-state waveform within the startup time, the amplitude of the adjusted steady-state waveform within the startup time smoothly transitions from zero to the amplitude of the linear motor in the steady vibration state.

8. The non-transitory machine-readable storage medium according to claim 6, wherein the adjusting the amplitude of the original steady-state waveform within the stop time as being smoothly changed from the amplitude of the linear motor in the steady vibration state to zero comprises:

superimposing a cosine waveform on the original steady-state waveform within the stop time, so that the amplitude of the adjusted steady-state waveform within the stop time smoothly transitions from the amplitude of the linear motor in the steady vibration state to zero;

or adjusting the original steady-state waveform within the stop time by using an ascent algorithm, so that the amplitude of the adjusted steady-state waveform within the stop time smoothly transitions from the amplitude of the linear motor in the steady vibration state to zero.

9. An electronic device, comprising:

a linear motor;

one or more processors; and a memory, storing a program thereon;

the program, when executed by the one or more processors, causing the electronic device to implement operations:

obtaining a vibration description file;

recognizing a waveform type described in the vibration description file;

determining a startup time and a stop time from the vibration description file in a case that the waveform type described in the vibration description file is a steady-state waveform;

adjusting an amplitude of an original steady-state waveform described in the vibration description file by:

adjusting an amplitude of the original steady-state waveform within the startup time as being smoothly changed from zero to an amplitude of the linear motor in a steady vibration state, including:

superimposing a first cosine waveform on the original steady-state waveform within the startup time, wherein the first cosine waveform has a same duration as that of the startup time, and adjusting an amplitude of the original steady-state waveform within the stop time as being smoothly changed from the amplitude of the linear motor in the steady vibration state to zero;

obtaining a driving waveform based on an adjusted steady-state waveform; and controlling vibration of the linear motor of the electronic device based on the driving waveform to reduce noise within the startup time and the stop time.

10. The electronic device according to claim 9, wherein by superimposing the first cosine waveform on the original steady-state waveform within the startup time, the amplitude of the adjusted steady-state waveform within the startup time smoothly transitions from zero to the amplitude of the linear motor in the steady vibration state.

11. The electronic device according to claim 9, wherein the adjusting an amplitude of the original steady-state waveform within the startup time as being smoothly changed from zero to an amplitude of the linear motor in a steady vibration state comprises:

adjusting the original steady-state waveform within the startup time by using an ascent algorithm, so that the amplitude of the adjusted steady-state waveform within the startup time smoothly transitions from zero to the amplitude of the linear motor in the steady vibration state.

12. The electronic device according to claim 9, wherein the adjusting an amplitude of the original steady-state waveform within the stop time as being smoothly changed from the amplitude of the linear motor in the steady vibration state to zero comprises:

superimposing a cosine waveform on the original steady-state waveform within the stop time, so that the amplitude of the adjusted steady-state waveform within the stop time smoothly transitions from the amplitude of the linear motor in the steady vibration state to zero.

13. The electronic device according to claim 9, wherein the adjusting an amplitude of the original steady-state waveform within the stop time as being smoothly changed from the amplitude of the linear motor in the steady vibration state to zero comprises:

adjusting the original steady-state waveform within the stop time by using an ascent algorithm, so that the amplitude of the adjusted steady-state waveform within the stop time smoothly transitions from the amplitude of the linear motor in the steady vibration state to zero.

14. The non-transitory machine-readable storage medium according to claim 6, wherein the adjusting an amplitude of the original steady-state waveform within the startup time as being smoothly changed from zero to an amplitude of the linear motor in a steady vibration state comprises:

adjusting the original steady-state waveform within the startup time by using an ascent algorithm, amplitude of the adjusted steady-state waveform within the startup time smoothly transitions from zero to the amplitude of the linear motor in the steady vibration state.

* * * * *